(12) United States Patent
Cheng et al.

(10) Patent No.: US 7,937,628 B2
(45) Date of Patent: *May 3, 2011

(54) METHOD AND SYSTEM FOR A NON-VOLATILE MEMORY WITH MULTIPLE BITS ERROR CORRECTION AND DETECTION FOR IMPROVING PRODUCTION YIELD

(75) Inventors: Iue-Shuenn Cheng, San Diego, CA (US); Xuemin Chen, San Diego, CA (US); Mihai Lupu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 12/273,117

(22) Filed: Nov. 18, 2008

(65) Prior Publication Data

US 2009/0070625 A1 Mar. 12, 2009

Related U.S. Application Data

(63) Continuation of application No. 11/288,627, filed on Nov. 29, 2005, now Pat. No. 7,469,368.

(51) Int. Cl.
*G11C 29/00* (2006.01)
(52) U.S. Cl. .................................. 714/710; 714/756
(58) Field of Classification Search .................. 714/710, 714/756
See application file for complete search history.

(56) References Cited

U.S. PATENT DOCUMENTS

| | | | | |
|---|---|---|---|---|
| 5,070,474 | A * | 12/1991 | Tuma et al. | 703/24 |
| 5,459,850 | A * | 10/1995 | Clay et al. | 711/171 |
| 5,500,826 | A * | 3/1996 | Hsu et al. | 365/230.01 |
| 5,535,369 | A * | 7/1996 | Wells et al. | 711/171 |
| 5,996,105 | A * | 11/1999 | Zook | 714/755 |
| 6,018,626 | A * | 1/2000 | Zook | 703/24 |
| 6,683,817 | B2 * | 1/2004 | Wei et al. | 365/230.03 |
| 7,239,547 | B2 * | 7/2007 | Suda | 365/185.09 |
| 7,409,623 | B2 * | 8/2008 | Baker et al. | 714/763 |
| 7,412,575 | B2 * | 8/2008 | Park et al. | 711/159 |
| 7,469,368 | B2 * | 12/2008 | Chen et al. | 714/710 |

* cited by examiner

*Primary Examiner* — Stephen M Baker
(74) *Attorney, Agent, or Firm* — McAndrews, Held & Malloy, Ltd.

(57) ABSTRACT

A method and system for a non-volatile memory (NVM) with multiple bits error correction are provided and may include detecting bit errors in a memory element, of a NVM array integrated within a chip, which remain uncorrected after forward error correction. A redundant memory element may be utilized when the errors may be detected utilizing a cyclic redundancy check, may be within the NVM array, and may include secure information. Access to the secure information and/or the chip may be disabled when the errors are detected. The FEC operation may include one or both of an error location operation and a correction operation. The errors may be corrected when a location may be known to include the errors. The NVM array may be partitioned into regions. At least one of the redundant memory elements may be substituted in place of the memory element based on a substitution priority.

37 Claims, 10 Drawing Sheets

METHOD AND SYSTEM FOR A NON-VOLATILE MEMORY WITH MULTIPLE BITS ERROR CORRECTION AND DETECTION FOR IMPROVING PRODUCTION YIELD

CROSS-REFERENCE TO RELATED APPLICATIONS/INCORPORATION BY REFERENCE

This application is a continuation of U.S. application Ser. No. 11/288,627 filed Nov. 29, 2005.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to handling data storage. More specifically, certain embodiments of the invention relate to a method and system for a non-volatile memory (NVM) with multiple bits error correction and detection for improving production yield.

BACKGROUND OF THE INVENTION

Non-volatile memories (NVMs) are generally characterized by their ability to retain stored data when power is turned off or when power is temporarily interrupted. Under similar conditions, other memory technologies, such as synchronous RAM (SRAM) and dynamic RAM (DRAM), for example, lose the stored information. One type of NVMs consists of read-only memories (ROMs), also referred to as masked ROMs. Data is stored into a ROM during production, for example, and may not be altered by a user.

Another type of NVMs consists of programmable ROMs (PROMs). In PROMs, a user may store or program data into the device by, for example, connecting links in the device to provide interconnections to the memory storage elements. Some types of PROM devices may only allow a user to program data into the device once. Other PROM technologies, such as erasable programmable ROMs (EPROMs), electrically erasable programmable ROMs (EEPROMs), and flash memories, for example, may support multi-stage programming that enables the user to program the device multiple times. For example, ultraviolet light may be utilized to erase data stored in EPROMs. The EPROM memory cell may consist of a single transistor, enabling memory devices with high storage densities. However, the use of EPROMs may be limited because removal from the system where the device is being used is generally required for erasure. Moreover, selective erasure of memory locations may be quite difficult to achieve, using for example, ultraviolet light erasure methods.

EEPROM technology, for example, supports electrical programming of data and electrical erasure of stored data. In this regard, EEPROMs utilize a WRITE operation for programming data into selective memory locations and an ERASE operation to erase data from selective memory locations. The EEPROM cell utilizes two transistors and a tunnel oxide and is generally larger in size than an EPROM memory cell. EEPROMs are generally specified based on the number of write-erase cycles that may be performed before failure.

Flash technology, for example, utilizes a single transistor memory cell that provides hot carrier programming and tunnel erase operations. In this regard, flash technology combines the programmability of the EPROM and the erasability of the EEPROM. The term "flash" refers to the ability of erasing the entire memory device or a large portion of the memory device using a single erase operation. The size of the flash memory cell make flash memory devices cost competitive with DRAMs.

A NVM device, whether a ROM device or a PROM device, may comprise an array of NVM blocks, where each NVM block comprises rows and/or columns of memory cells. In some instances, the production process may result in a large number of defects in the NVM device that may render the device unusable. These defects may be detected during production testing or during programming operations, for example. The defects may include damaged or non-operational memory cells, bit and/or word lines, write drivers, and/or sense amplifiers, for example. The cost of producing NVMs increases as a result of low production yields from high numbers of defects.

In order to increase production yields, and therefore compensate for the presence of existing defects, redundant elements may be utilized in the design of NVMs to replace defective elements. However, the use of redundant elements alone may not be an effective solution in those instances when the number of defects is very high. Since many existing applications and/or systems utilize NVMs, there is a growing demand for NVM architectures that are more robust to defects that may result from the production process.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a non-volatile memory (NVM) with multiple bits error correction and detection for improving production yield, substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain embodiments of the invention may be found in a system and/or method for a non-volatile memory (NVM) with multiple bits error correction and detection for improving production yield. In accordance with various embodiments of the invention, forward error correction (FEC) operations and cyclic redundancy check (CRC) operations may be utilized in an NVM array integrated in a chip to correct errors in memory elements and detect remaining errors respectively. When remaining errors are detected, the memory element may be substituted by redundant memory elements in the NVM array. An erasure operation in the FEC may be utilized to correct errors when the error location is known. The NVM array may be partitioned into classes that may each have specified FEC operations and a specified priority to substitute memory elements by redundant memory elements. The FEC and CRC operations may be utilized to protect secure information stored in the NVM array by disabling the chip when errors are detected while reading the secure information.

Figure 1:
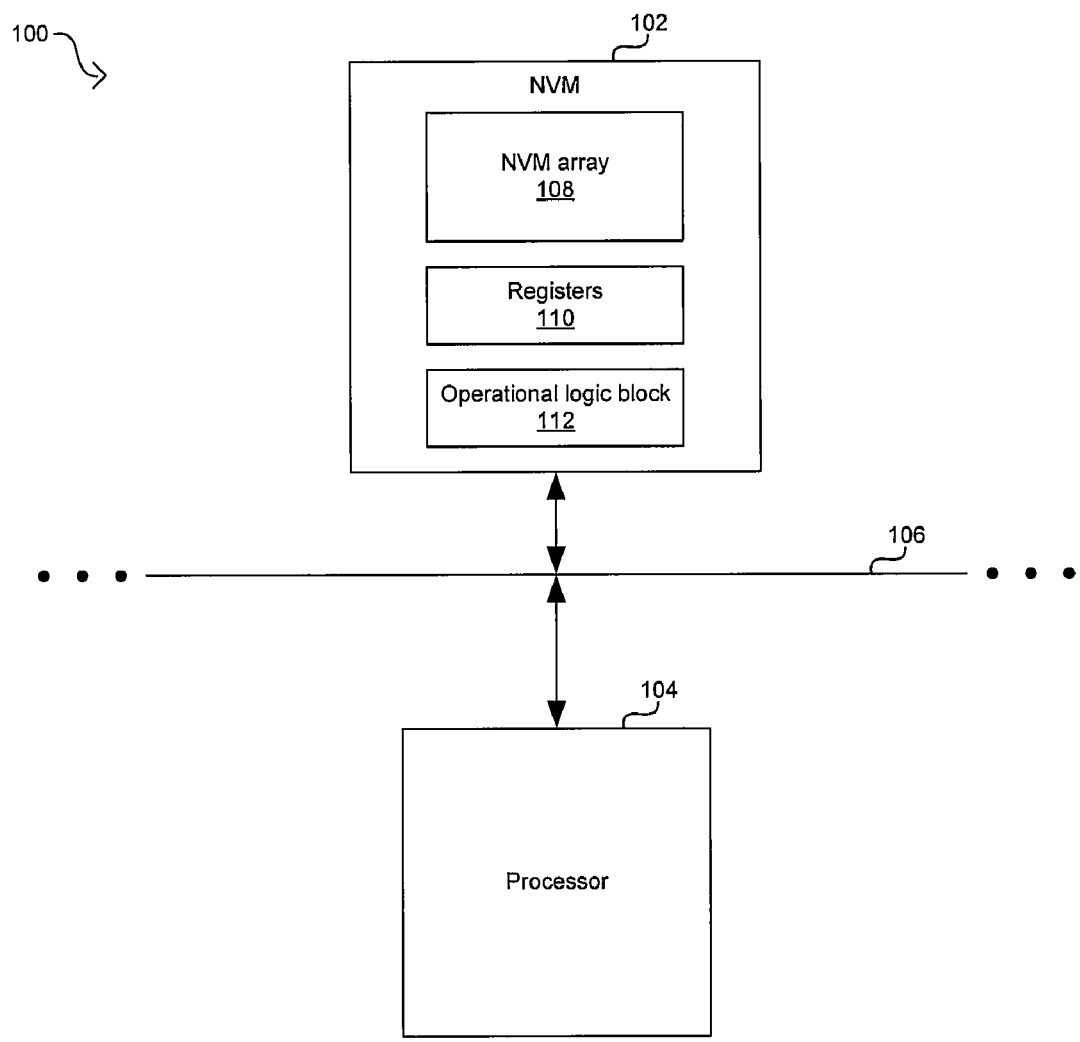
FIG. 1 is a block diagram that illustrates an exemplary system comprising a non-volatile memory (NVM) device and a processor, in accordance with an embodiment of the invention.

Referring to FIG. 1, there is shown a system 100 that may comprise a non-volatile memory (NVM) device 102, a processor 104, and a bus 106. The NVM device 102 may comprise an NVM array 108, registers 110, and an operational logic block 112. The NVM device 102 may comprise suitable logic, circuitry, and/or code that may be enabled to store data. The NVM device 102 may be implemented as an integrated circuit or chip, for example. The NVM device 102 may be enabled to retain the stored data when power is turned off or when power is temporarily interrupted, for example. In this regard, the NVM device 102 may correspond to a read-only memory (ROM) or to a multi-stage programmable ROM, for example. In one embodiment of the invention, the ROM may be designed so that it may only be programmed once. In certain instances, attempts to program the device once it has been programmed may result is destruction of the device or loss of the data stored therein.

The NVM device 102 may be enabled to perform forward error correction (FEC) operations and/or cyclic redundancy check (CRC) operations to correct and/or detect programming errors that may result from, for example, production or manufacturing steps. The FEC operations may correspond to encoding and/or decoding processes utilized to correct and/or detect a predetermined number of bit errors or symbol errors. The FEC operations may add redundancy to original data via the encoding process by utilizing a predetermined algorithm, for example. The original data, prior to FEC encoding, may be referred to as information bits or information symbols. The data that results from the addition of error correction information via the FEC encoding may be referred to as coded bits or coded symbols. When the coded bits or coded symbols comprise the original data without being modified by the FEC encoding process, the FEC operation may be referred to as systematic. When the FEC encoding modifies the original data, the FEC operation may be referred to as nonsystematic.

The FEC coding and encoding processes may be based on block codes or convolutional codes, for example. Block codes may generally operate on fixed-size blocks or groups of bits or symbols of a predetermined size. Block codes may comprise, but need not be limited to, Reed-Solomon code, BCH code, and Hamming code, for example. Convolutional codes may generally operate on bit or symbol streams of an arbitrary length. In some instances, a convolutional code may be enabled to operate as a block code. Convolutional codes may be decoded utilizing the Viterbi algorithm, for example.

The FEC decoding process may comprise a bit error location operation and a bit error correction operation. The bit error correction operation may also be referred to as an erasure operation, for example. The bit error location operation may be utilized to locate bit errors in FEC-encoded blocks of bits or FEC-encoded symbols. When the bit error location is known via the bit error location operation, the FEC decoding process may utilize the bit error correction operation to correct a predetermined number of bit errors. In some instances, the location of the bit errors may be known without utilizing the bit error location operation. In these instances, the FEC decoding process may utilize only the bit error correction operation and may allow correction of a larger number of bit errors than when the FEC decoding process requires the bit error location operation.

The FEC decoding process may follow the minimum Hamming distance $d=2t+1$, where t corresponds to the number of correctable bit errors in an FEC-encoded block of bits or an FEC-encoded symbol that may be corrected by the FEC operation. Information that may be utilized to implement the FEC operations may be programmed into the registers 110 via the bus 106, for example.

The CRC operations supported by the NVM device 102 may comprise at least one process for determining a remainder or checksum for a block of bits or symbol by utilizing a predetermined polynomial. In this regard, an N-bit CRC operation may require a predetermined polynomial of degree N, for example. The CRC operation may be performed on, for example, an FEC-encoded block of bits or an FEC-encoded symbol. The checksum produced by the CRC operation may be appended to the block of bits or to the symbol. The CRC operations may also comprise at least one process for verifying whether programming errors have occurred in the block of bits or the symbol by comparing the original checksum with a checksum generated after the programming operation. Information that may be utilized to implement the CRC operations may be programmed into the registers 110 via the bus 106, for example.

The NVM array 108 may comprise suitable logic, circuitry, and/or code that may be enabled to store data in at least one of a plurality of memory elements. Each memory element may comprise at least one memory cell, for example. The NVM array 108 may also be enabled to select at least one memory cell or memory element from the array to perform read or write instructions that may be provided to the NVM device 102 via the bus 106, for example. The registers 110 may comprise suitable logic, circuitry, and/or code that may be enabled to store a plurality of information regarding the operation of the NVM device 102. For example, the registers 110 may be enabled to store information regarding the FEC and CRC operations supported by the NVM device 102. Information may be stored into the registers 110 via the bus 106, for example.

The operational logic block 112 may comprise suitable logic, circuitry, and/or code that may be enabled to control and/or to perform operations in the NVM device 102. The operational logic block 112 may be enabled to control and/or to perform programming, correction, detection, read, and/or write operations, for example. The operational logic block 112 may utilize information stored in the registers 110 to control and/or to perform operations in the NVM device 102. For example, the operational logic block 112 may utilize information stored in the registers 110 that may regard the FEC and CRC operations supported by the NVM device 102.

The processor 104 may comprise suitable logic, circuitry, and/or code that may be enabled to control at least a portion of the operation of the NVM device 102. In this regard, the processor 104 may be enabled to control at least a portion of the operation of the NVM device 102 by programming information into the registers 110 via the bus 106, for example. The processor 104 may be enabled to control at least a portion of the programming or storage of data into the NVM device 102. The processor 104 may be enabled to generate at least one signal that controls the programming or storage of data into the NVM device 102. For example, the processor 104 may generate at least one WRITE instruction for programming data into the NVM device 102. Moreover, the processor 104 may be enabled to control at least a portion of the reading or retrieval of data from the NVM device 102. The processor 104 may be enabled to generate at least one signal that controls the reading or retrieval of data from the NVM device 102. For example, the processor 104 may generate at least one READ instruction for reading data from the NVM device 102.

The system 100 may correspond to a programming system utilized for production programming, for example. In this regard, the NVM device 102 may be coupled to the processor 104 via the bus 106 to enable the processor 104 to perform programming, testing, and/or verification operations on the NVM device 102, for example. Once the programming, testing, and/or verification of the NVM device 102 is completed, the NVM device 102 may be decoupled from the processor 104 and may be installed or assembled into an application system.

The system 100 may also correspond to an application system where the NVM device 102 and the processor 104 may be assembled to operate together as part of the application system. In this instance, the processor 104 may be utilized to read and/or write data into the NVM device 102 via the bus 106 in accordance with the operations of the application system.

Figure 2:
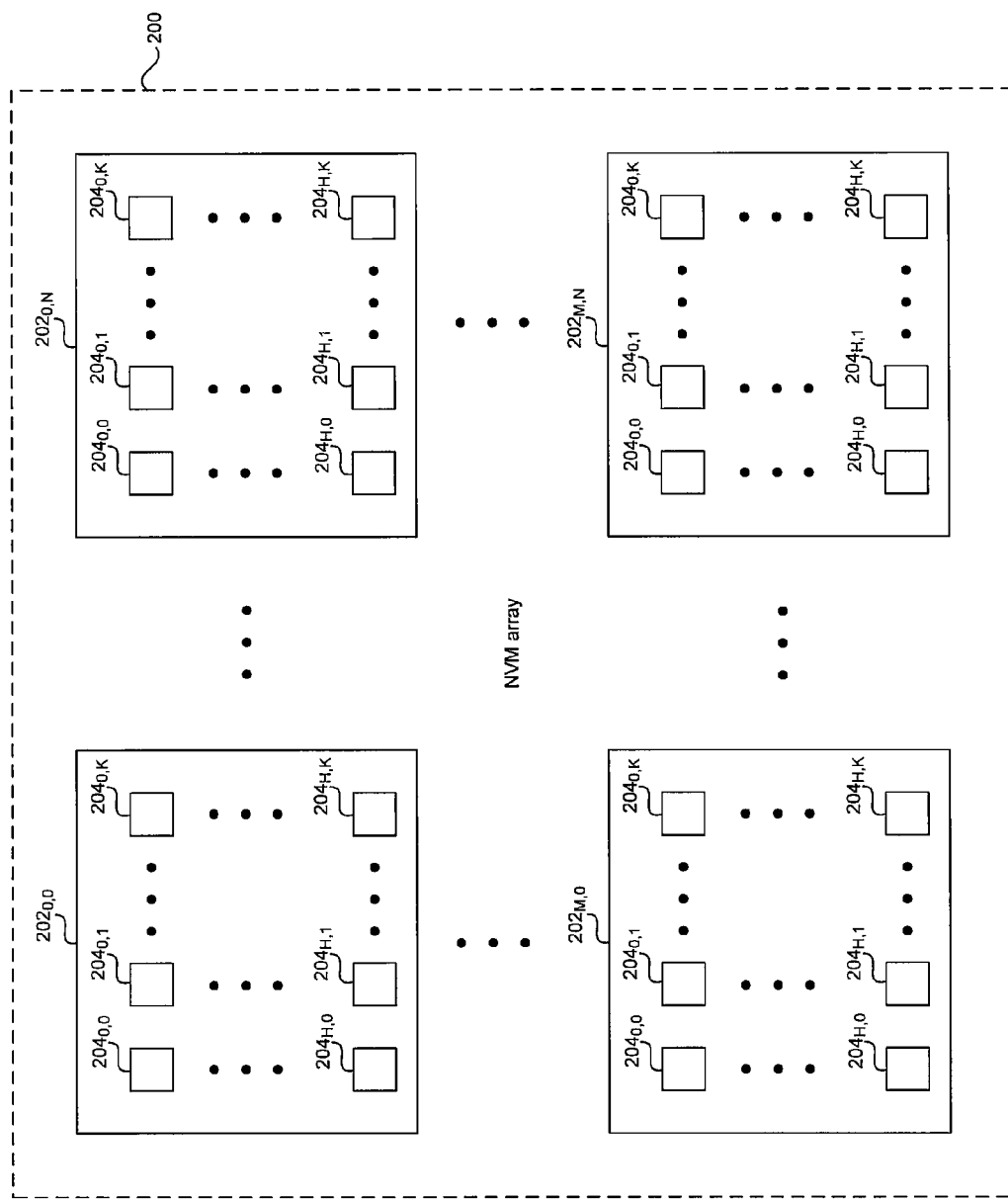
FIG. 2 is a block diagram that illustrates an exemplary memory elements and memory cells in an NVM array, in accordance with an embodiment of the invention.

FIG. 2 is a block diagram that illustrates an exemplary memory elements and memory cells in an NVM array, in accordance with an embodiment of the invention. Referring to FIG. 2, there is shown an NVM array 200 that may comprise memory elements $202_{0,0}, \ldots, 202_{M,N}$, where M+1 is the number of memory element rows, N+1 is the number of memory element columns, and $M \geq 1$ and $N \geq 1$. A memory element may also be referred to as a memory block or a block of memory bits, for example. The NVM array 200 may correspond to the NVM array 108 in FIG. 1, for example. The memory elements $202_{0,0}, \ldots, 202_{0,N}$ in the NVM array 200 may correspond to a first or top memory element row, while the memory elements $202_{M,0}, \ldots, 202_{M,N}$ may correspond to a last or bottom memory element row. Similarly, the memory elements $202_{0,0}, \ldots, 202_{M,0}$ in the NVM array 200 may correspond to a first or leftmost memory element column, while the memory elements $202_{0,N}, \ldots, 202_{M,N}$ may correspond to a last or rightmost memory element column.

In one embodiment of the invention, each of the memory elements $202_{0,0}, \ldots, 202_{M,N}$, in the NVM array 200 may comprise memory cells $204_{0,0}, \ldots, 204_{H,K}$, where H+1 is the number of memory cell rows, K+1 is the number of memory cell columns, and $H \geq 1$ and $K \geq 1$. Each memory cell may store at least one bit of data, for example. In this regard, a memory cell may comprise suitable logic and/or circuitry that corresponds to an NVM technology for the storage for data. The memory cells $204_{0,0}, \ldots, 204_{0,K}$ may correspond to a first or top memory cell row in a memory element, while the memory cells $204_{H,0}, \ldots, 204_{H,K}$ may correspond to a last or bottom memory cell row in the memory element. Similarly, the memory cells $204_{0,0}, \ldots, 204_{H,0}$ may correspond to a first or leftmost memory cell column in the memory element, while the memory cells $204_{0,K}, \ldots, 204_{H,K}$ may correspond to a last or rightmost memory cell column in the memory element.

In another embodiment of the invention, the number of rows and/or columns of memory cells may be specified for each of the memory elements $202_{0,0}, \ldots, 202_{M,N}$. For example, at least a portion of the NVM array 200 may comprise memory elements with the same number of memory cell rows but with varying number of memory cell columns. Similarly, at least a portion of the NVM array 200 may comprise memory elements with the same number of memory cell columns but with varying number of memory cell rows, for example. Moreover, at least a portion of the NVM array 200 may comprise memory elements with varying memory cell rows and memory cell columns, for example.

Figure 3A:
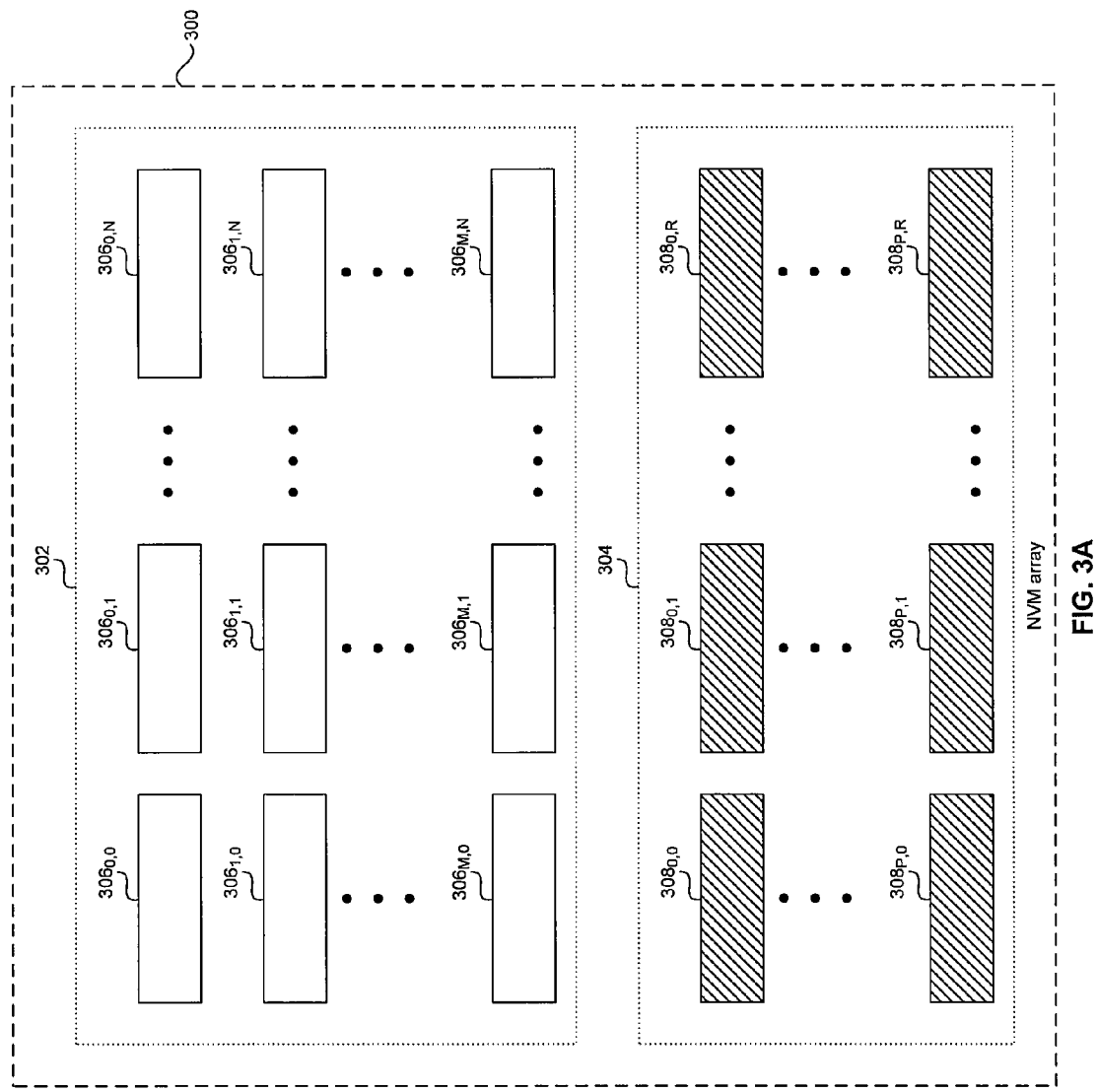
FIG. 3A is a block diagram that illustrates exemplary memory elements and redundant memory elements in an NVM array, in accordance with an embodiment of the invention.

FIG. 3A is a block diagram that illustrates exemplary memory elements and redundant memory elements in an NVM array, in accordance with an embodiment of the invention. Referring to FIG. 3A, there is shown an NVM array 300 that may comprise a first region or first portion 302 of memory elements and a second region or second portion 304 of redundant memory elements. The first portion 302 of the NVM array 300 may comprise memory elements $306_{0,0}, \ldots, 306_{M,N}$, where M+1 is the number of memory element rows, N+1 is the number of memory element columns, and $M \geq 1$ and $N \geq 1$. The memory elements $306_{0,0}, \ldots, 306_{0,N}$ may correspond to a first or top memory element row, while the memory elements $306_{M,0}, \ldots, 306_{M,N}$ may correspond to a last or bottom memory element row. Similarly, the memory elements $306_{0,0}, \ldots, 306_{M,0}$ may correspond to a first or leftmost memory element column, while the memory elements $306_{0,N}, \ldots, 306_{M,N}$ may correspond to a last or rightmost memory element column. Each of the memory elements of the first portion 302 of the NVM array 300 in FIG. 3A may comprise at least one non-volatile memory cell and each memory cell may be enabled to store at least one bit of data, for example.

The second portion 304 of the NVM array 300 may comprise redundant memory elements $308_{0,0}, \ldots, 308_{P,R}$, where P+1 is the number of redundant memory element rows, R+1 is the number of redundant memory element columns, and $P \geq 1$ and $R \geq 1$. Hashed lines indicate the redundant memory elements in FIG. 3A. A redundant memory element may also be referred to as a redundant memory block or a block of redundant memory bits, for example. The redundant memory elements $308_{0,0}, \ldots, 308_{0,R}$ may correspond to a first or top redundant memory element row, while the redundant memory elements $308_{P,0}, \ldots, 308_{P,R}$ may correspond to a last or bottom redundant memory element row. Similarly, the redundant memory elements $308_{0,0}, \ldots, 308_{P,0}$ may correspond to a first or leftmost redundant memory element column, while the redundant memory elements $308_{0,R}, \ldots, 308_{P,R}$ may correspond to a last or rightmost redundant memory element column, for example. Each of the redundant memory elements of the second portion 304 of the NVM array 300 in FIG. 3A may comprise at least one non-volatile memory cell and each memory cell may be enabled to store at least one bit of data, for example.

Redundant memory elements may be utilized to substitute memory elements in the first portion 302 of the NVM array 300 when defects arising from manufacturing, for example, result in programming errors in at least a portion of the memory elements. The number of redundant memory elements in the NVM array 300 may be determined based on information regarding the production yield of the NVM device 102, for example.

Figure 3B:
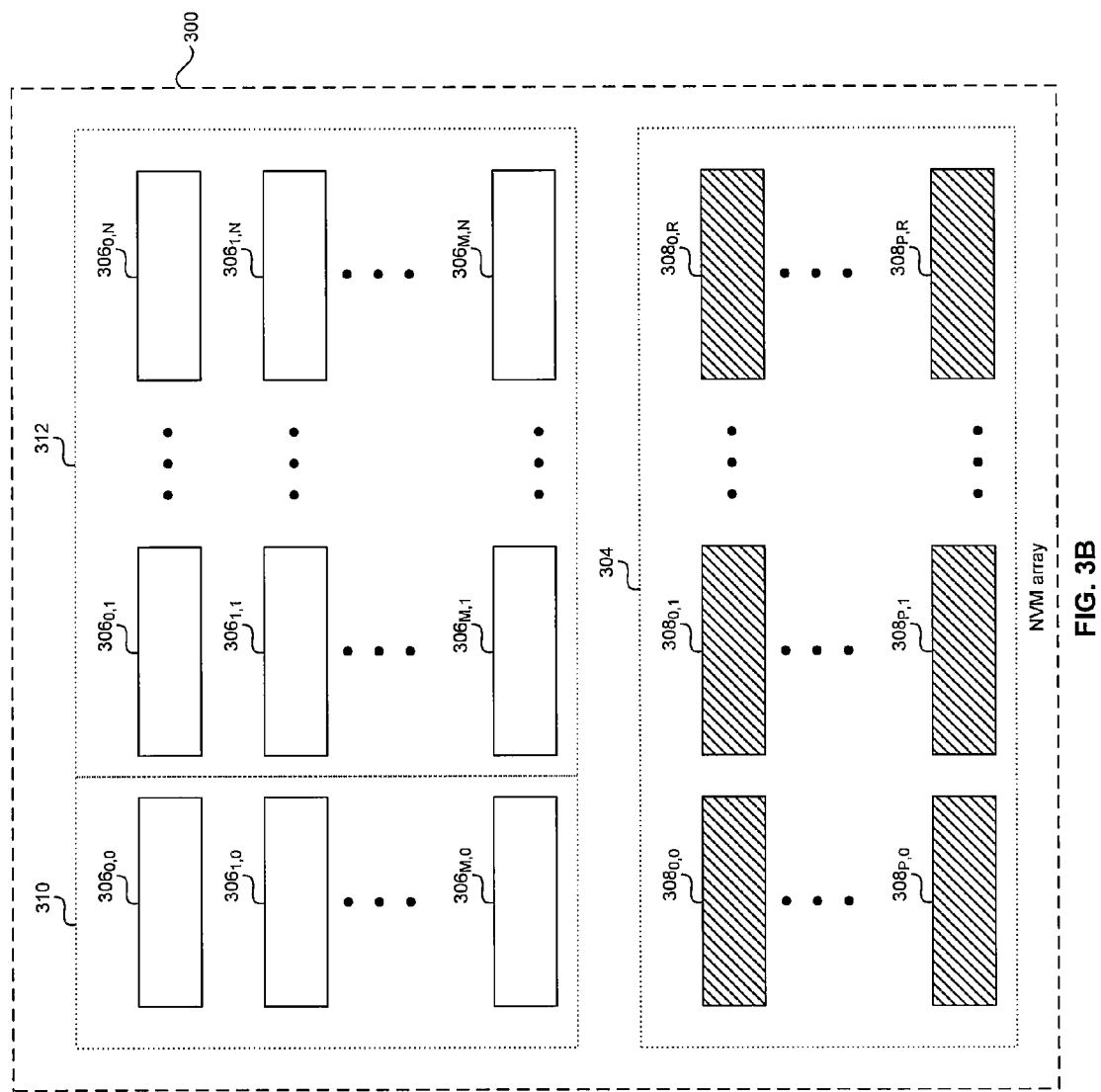
FIG. 3B is a block diagram that illustrates an exemplary NVM array partitioned into memory classes, in accordance with an embodiment of the invention.

FIG. 3B is a block diagram that illustrates an exemplary NVM array partitioned into memory classes, in accordance with an embodiment of the invention. Referring to FIG. 3B, there is shown the NVM array 300 from FIG. 3A where the memory elements may be partitioned into at least one memory class or memory region. In this instance, the memory elements in the NVM array 300 may be partitioned into a first class 310 and a second class 312 while the redundant memory elements $308_{0,0}, \ldots, 308_{P,R}$ are shown as part of the second portion 304 as described in FIG. 3A. While a two-class partition scheme is shown in FIG. 3B for purposes of illustration, the NVM array 300 may be enabled to support a plurality of memory element partitioning schemes. Each memory class may comprise at least one memory element. For example, the first class 310 may comprise the memory elements $306_{0,0}, \ldots, 306_{M,0}$. The second class 312 may comprise the memory elements $306_{0,1}, \ldots, 306_{M,N}$, for example. Each of the memory elements of the first class 310 and the second class 312 in FIG. 3B may comprise at least one non-volatile memory cell and each memory cell may be enabled to store at least one bit of data, for example.

Each memory class or memory region may be associated with a particular type of data. For example, when an NVM array is utilized in application systems comprising several clients or users, a memory class may be implemented within the NVM array for each user to store security information associated with the user. In this regard, only a specified or an appropriate user may access information in the corresponding memory class.

Each memory class or memory region may have an associated FEC operation and/or CRC operation. For example, the first class 310 may utilize a 1-bit correction FEC operation while the second class 312 may utilize a 2-bit correction FEC operation. In another example, the first class 310 may utilize a 16-bit CRC while the second class 312 may utilize a 32-bit CRC. Information regarding the FEC operation and/or CRC operation associated with each partitioned memory class in the NVM array 300 may be stored in the registers 110 in FIG. 1, for example.

Each memory class or memory region may also comprise an associated substitution priority that may be utilized when substituting or replacing memory elements with redundant memory elements. The substitution priority may be utilized to indicate the order in which memory elements from various memory classes may be substituted with at least one redundant memory element when programming errors occur. For example, any memory element from the first class 310 that needs to be substituted with redundant memory elements may be substituted before any memory element from the second class 312 that needs substitution. Information regarding the substitution priority associated with each partitioned memory class in the NVM array 300 may be stored in the registers 110 in FIG. 1, for example.

Figure 4A:
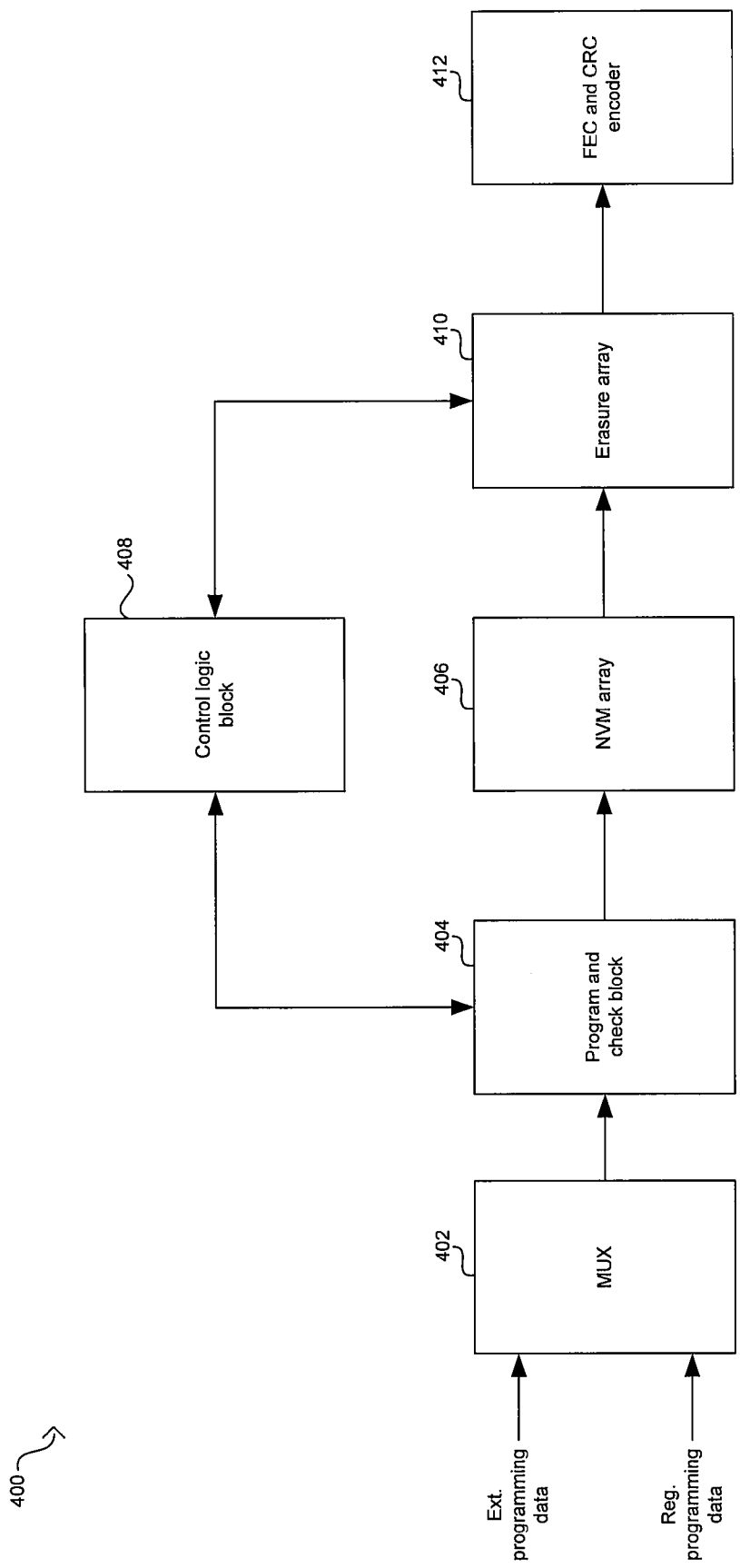
FIG. 4A is a block diagram that illustrates memory programming with correction and detection encoding operations, in accordance with an embodiment of the invention.

FIG. 4A is a block diagram that illustrates memory programming with correction and detection encoding operations, in accordance with an embodiment of the invention. Referring to FIG. 4A, there is shown an NVM device 400 that may comprise a multiplexer (MUX) 402, a program and check block 404, an NVM array 406, a control logic block 408, an erasure array 410, and an FEC and CRC encoder 412. The NVM device 400 may correspond to the NVM device 102 in FIG. 1, for example. The MUX 402 may comprise suitable logic, circuitry, and/or code that may be enabled to select between external programming data and register programming data. The NVM device 400 may receive external programming data via an external bus and may receive register programming data from internal registers, for example. In this regard, the external bus may correspond to the bus 106 shown in FIG. 1 and the internal registers may correspond to the registers 110. A processor, such as the processor 104 shown in FIG. 1, may control the selection operation in the MUX 402.

The programming and check block 404 may comprise suitable logic, circuitry, and/or code that may be enabled to control the programming of the NVM array 406. The programming and check block 404 may program the NVM array 406 with data received from the MUX 402. In this regard, the programming and check block 404 may program the received data into at least one memory element in the NVM array 406 and may verify whether the programming was successful. When the programming is successful, the programming and check block 404 may program additional data received from the MUX 402. When the programming is unsuccessful, the programming and check block 404 may repeat the programming operation until a successful programming is verified or until a threshold number of programming attempts has been reached. More than one programming attempts may be necessary in some instances in order to enable the appropriate links in the memory cell to connect and store the data. When the threshold number of programming attempts is reached without successfully programming the data received, the programming and check block 404 may perform error correction and/or error detection operations by utilizing FEC and/or CRC operations.

The programming and check block 404 may be enabled to perform FEC and/or CRC encoding and/or decoding processes to detect programming errors and to correct at least a portion of the programming errors detected. When all the programming errors in a memory element are corrected by the FEC operations and verified by the CRC operations, the programming and check block 404 may store the FEC-encoded data into the appropriate memory element. When instances where all the programming errors in a memory element are not corrected by the FEC operations as verified by the CRC operations, the programming and check block 404 may substitute the memory element with redundant memory elements in the NVM array 406. In this regard, when the NVM array 406 is partitioned into a plurality of memory classes or memory regions, the programming and check block 404 may utilize the substitution priority associated with each memory class when substituting a memory element with at least one redundant memory element. Information regarding FEC and/or CRC operations may be provided to the programming and check block 404 via the registers 110, for example.

The programming and check block 404 may be enabled to communicate with the control logic block 408 to control the substitution of memory elements in the NVM array 406 with redundant memory elements. The programming and check block 404 may also communicate with the control logic block 408 to receive information regarding the location of programming errors in particular memory elements. When the location of bit errors is known, the programming and check block 404 may implement FEC decoding processes that utilize only the bit error correction operation in order to enable correction of a higher number of bit errors than may be achieved when the location of the programming errors is unknown.

The control logic block 408 may comprise suitable logic, circuitry, and/or code that may be enabled to control the substitution of memory elements in the NVM array 406 with redundant memory elements. The control logic block 408 may also be enabled to provide the programming and check block 404 with information regarding the location of programming errors in the memory elements from the erasure array 410. The erasure array 410 may comprise suitable logic, circuitry, and/or code that may be enabled to store information regarding the known location of bit errors in the memory elements of the NVM array 406. In this regard, the erasure array 410 may utilize buffers to store information regarding the known location of bit errors.

The FEC and CRC encoder 412 may comprise suitable logic, circuitry, and/or code that may be enabled to provide FEC and/or CRC encoding processes to data stored in the NVM array 406 and/or to information stored in the erasure array 410. In this regard, the FEC and CRC encoder 412 may be utilized to correct and/or protect data from manipulation and/or tampering once stored in the NVM array 406 or the erasure array 410. Information regarding. FEC and CRC encoding processes in the FEC and CRC encoder 412 may be provided via the registers 110, for example.

Figure 4B:
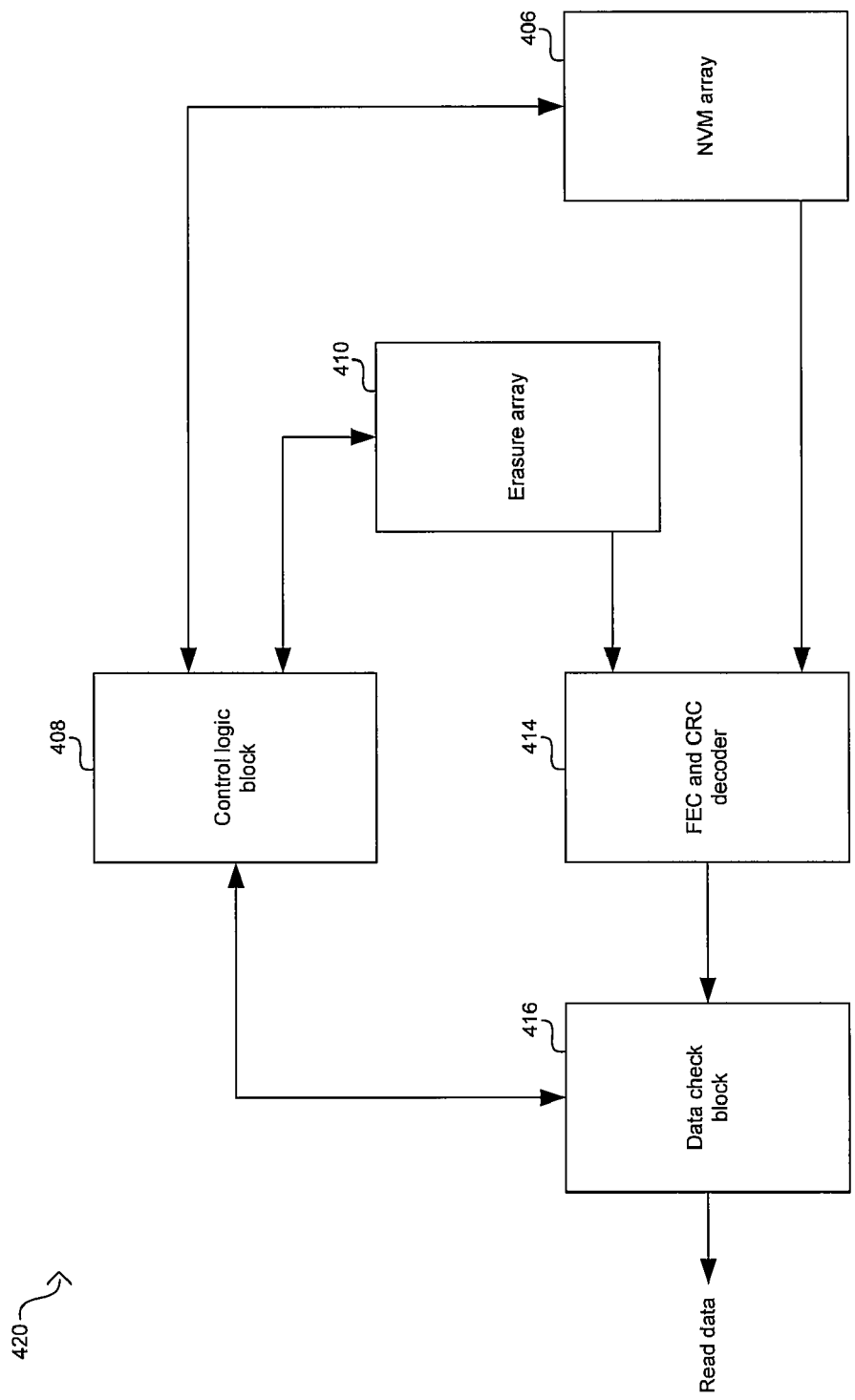
FIG. 4B is a block diagram that illustrates data reading with correction and detection decoding operations, in accordance with an embodiment of the invention.

FIG. 4B is a block diagram that illustrates data reading with correction and detection decoding operations, in accordance with an embodiment of the invention. Referring to FIG. 4B, there is shown an NVM device 420 that may comprise the NVM array 406, the control logic block 408, and the erasure array 410 as shown in FIG. 4A. The NVM device 420 may also comprise an FEC and CRC decoder 414 and a data check block 416. The NVM device 420 may correspond to the NVM device 102 in FIG. 1, for example. The control logic block 408 may be adapted to communicate information regarding the data stored in the NVM array 406 and the erasure array 410 to the data check block 416. Moreover, the control logic block 408 may receive an indication from the data check block 416 that the data received from the FEC and CRC decoder 414 is valid or invalid, for example. When the data is invalid, the control logic block 408 may generate at least one signal to disable the operation of at least a portion of the NVM device 420, for example.

The FEC and CRC decoder 414 may comprise suitable logic, circuitry, and/or code that may be enabled to provide FEC and/or CRC decoding processes to data stored in the NVM array 406 and/or to information stored in the erasure array 410. In this regard, the FEC and CRC decoder 414 may be utilized to correct and/or protect data stored in the NVM array 406 or the erasure array 410. For example, when data stored in the NVM array 406 is tampered by an unauthorized user, the FEC decoding process may be able to correct a predetermined number of bit errors in the stored data. When all the bit errors are corrected, the CRC decoding process may indicate to the data check block 416 that the data to be read is valid data. When a portion of the bit errors remain after the FEC decoding process, the CRC decoding process may indicate to the data check block 416 that the data is not valid. Information regarding FEC and CRC decoding processes in the FEC and CRC decoder 414 may be provided via the registers 110, for example. The decoded data from the FEC and CRC decoder 414 may be transferred to the data check block 416. Moreover, information regarding the validity of the data may also be transferred from the FEC and CRC decoder 414 to the data check block 416.

The data check 416 may comprise suitable logic, circuitry, and/or code that may be enabled to generate read data from data received from the FEC and CRC decoder 414. For example, when the FEC and CRC decoder 414 indicates that data is valid, the data check block 416 may generate the read data from the data received from the FEC and CRC decoder 414. The data check block 416 may generate a signal or indication to the control logic block 416 that the data from the FEC and CRC decoder 414 is valid. When the FEC and CRC decoder 414 indicates that data is invalid, the data check block 416 may generate a signal or indication to the control logic block 408 to indicate that the data is invalid. In this instance, the data check block 416 may not generate the read data.

Figure 5A:
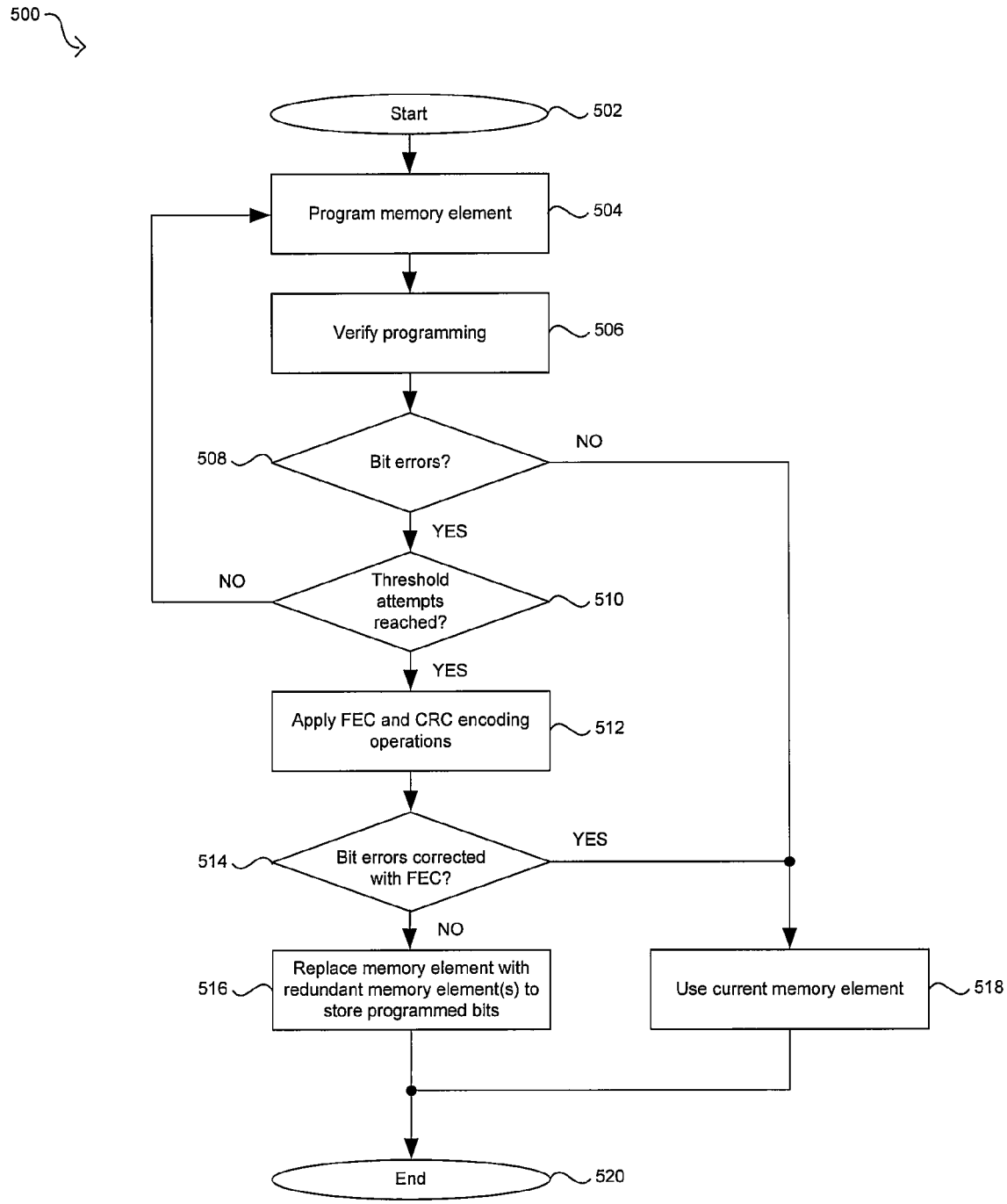
FIG. 5A is a flow diagram that illustrates exemplary steps for memory programming with correction and detection encoding operations, in accordance with an embodiment of the invention.

FIG. 5A is a flow diagram that illustrates exemplary steps for memory programming with correction and detection encoding operations, in accordance with an embodiment of the invention. Referring to FIG. 5A, there is shown a flow diagram 500. After start step 502, in step 504, data may be programmed into a memory element in an NVM array. In this regard, the NVM array may correspond to the NVM array described in FIGS. 1-4B, for example. In step 506, the data stored in the memory element may be read out of the memory element and may be compared to the original data to verify that the programming process has been successful. In step 508, when the verification in step 506 indicates that no programming errors occurred, the process in flow diagram 500 may proceed to step 518. In step 518, the original data or information bits may be stored without programming errors in the current memory element. After step 518, the process may proceed to end step 520.

Returning to step 508, when the verification in step 506 indicates that programming errors have occurred, the process in flow diagram 500 may proceed to step 510. In step 510, when the number of programming attempts of the original data into the memory element has not reached a threshold value, the process may proceed to step 504 where an additional programming of the original data into the memory element may be attempted. Returning to step 510, when the number of programming attempts of the original data into the memory element has reached the threshold value, the process may proceed to step 512.

In step 512, the original data or information bits may be FEC encoded and CRC encoded. In this regard, the FEC encoding process may be based on a predetermined number of correctable bits. The coded bits may be stored in the memory element in order to verify whether the utilization of redundancy introduced by the FEC encoding process may correct the programming errors in the memory element. In step 514, the coded bits may be FEC decoded and CRC decoded. The CRC decoding process may verify that the FEC encoding process resulted in the correction of all the programming errors in the memory element. When the FEC operation result in the correction of the programming errors in the memory element, the process may proceed to step 518. In steps 518, the coded bits may be stored in the current memory element. After step 518, the process may proceed to end step 520.

Returning to step 514, when the FEC operations do not correct all of the programming errors in the memory element, the process may proceed to step 516. In step 516, the memory element may be replaced or substituted with at least one redundant memory element in the NVM array. The original data or information bits may then be stored in the redundant memory elements. In this regard, verification that programming errors do not occur after programming the redundant memory elements may be necessary. When programming errors occur in the redundant memory elements and the programming errors may not be corrected by utilizing steps 504 through 514 in the flow chart 500, the redundant memory elements in step 516 may be replaced or substituted with additional redundant memory elements that may be available. After step 516, the process may proceed to end step 520. Regarding the process described in FIG. 5A, bit errors that may occur in the FEC and/or CRC data may also be considered when performing FEC and/or CRC operations.

Figure 5B:
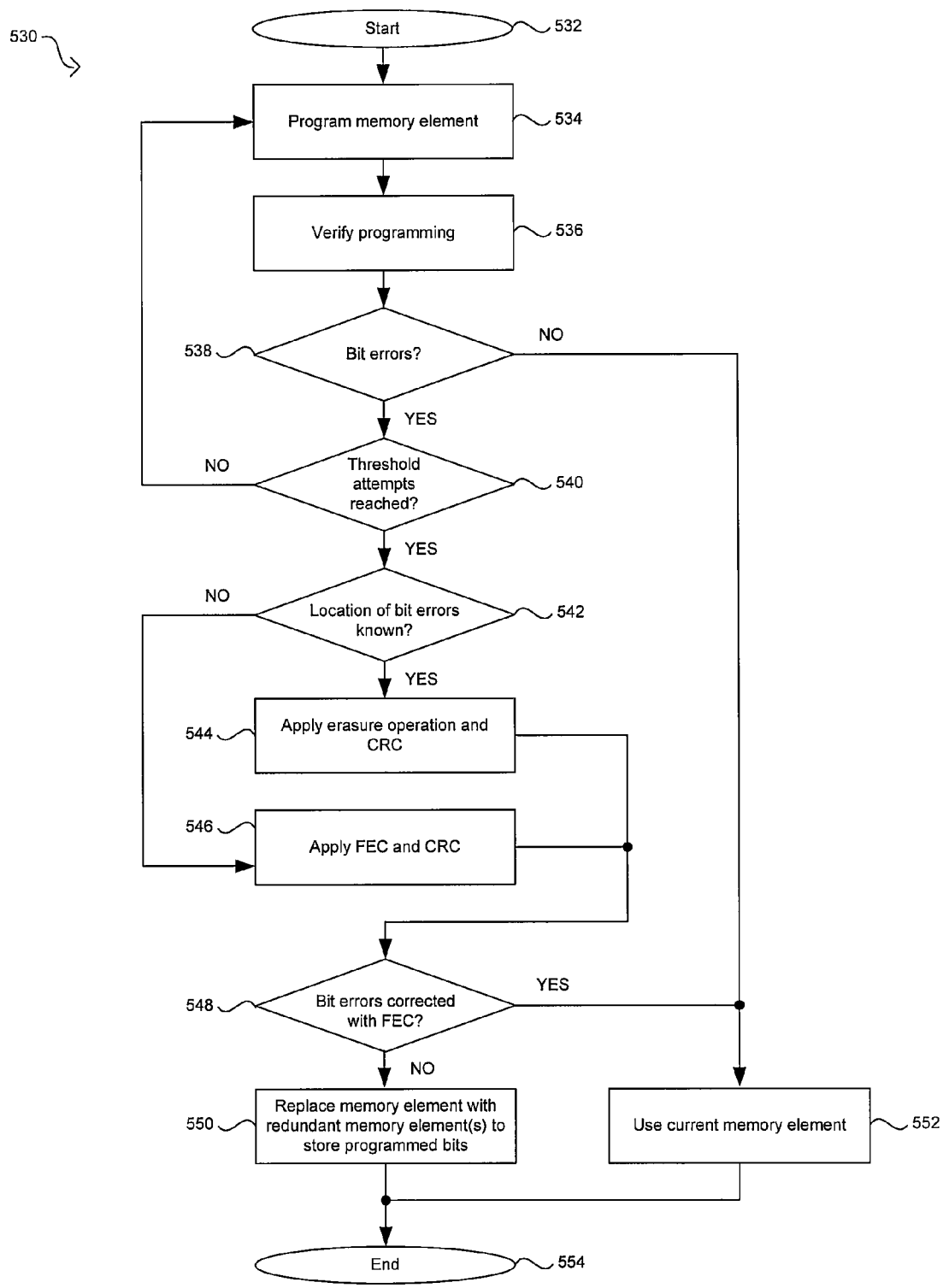
FIG. 5B is a flow diagram that illustrates exemplary steps for memory programming with correction and detection encoding operations with known bit error locations, in accordance with an embodiment of the invention.

FIG. 5B is a flow diagram that illustrates exemplary steps for memory programming with correction and detection encoding operations with known bit error locations, in accordance with an embodiment of the invention. Referring to FIG. 5B, there is shown a flow diagram 530. After start step 532, in step 534, data may be programmed into a memory element in an NVM array. In this regard, the NVM array may correspond to the NVM array described in FIGS. 1-4B, for example. In step 536, the data stored in the memory element may be read out of the memory element and may be compared to the original data to verify that the programming process has been successful. In step 538, when the verification in step 536 indicates that no programming errors occurred, the process in flow diagram 530 may proceed to step 552. In step 552, the original data or information bits may be stored without programming errors in the current memory element. After step 552, the process may proceed to end step 554.

Returning to step 538, when the verification in step 536 indicates that programming errors have occurred, the process in flow diagram 530 may proceed to step 540. In step 540, when the number of programming attempts of the original data into the memory element has not reached a threshold value, the process may proceed to step 534 where an additional programming of the original data into the memory element may be attempted. Returning to step 540, when the number of programming attempts of the original data into the memory element has reached the threshold value, the process may proceed to step 542. In step 542, when the location of the programming errors in the memory is known, the process may proceed to step 544. In step 544, the FEC encoding processes may be applied to the original bits or information bits and may be based on the known programming error locations. For example, the FEC encoding may correspond to the use of an FEC decoding that may be based on the bit error correction operation or erasure operation since the bit error location operation may not be necessary. The CRC encoding processes may be performed to verify the correction of the FEC encoding process. The coded bits may be stored in the memory element in order to verify whether the utilization of redundancy introduced by the FEC encoding process may correct the programming errors in the memory element. After step 544, the process in flow diagram 530 may proceed to step 548.

Returning to step 542, when the location of the programming errors in the memory location is not known, the process may proceed to step 546. In step 546, the original data or information bits may be FEC encoded and CRC encoded. In this regard, the FEC encoding process may be based on a predetermined number of correctable bits. The coded bits may be stored in the memory element in order to verify whether the utilization of redundancy introduced by the FEC encoding process may correct the programming errors in the memory element. In step 548, the coded bits may be FEC decoded and CRC decoded. The CRC decoding process verifies whether the FEC encoding process resulted in the correction of all the programming errors in the memory element. The FEC decoding may differ when the location of the programming errors is known and when the location of the programming errors is not known. In instances when the FEC operation may result in the correction of the programming errors in the memory element, the process may proceed to step 552. In step 552, the coded bits may be stored in the current memory element. After step 552, the process may proceed to end step 554.

Returning to step 548, when the FEC operations do not correct all of the programming errors in the memory element, the process may proceed to step 550. In step 550, the memory element may be replaced or substituted with at least one redundant memory element in the NVM array. The original data or information bits may then be stored in the redundant memory elements. In this regard, verification that programming errors do not occur after programming the redundant memory elements may be necessary. When programming errors occur in the redundant memory elements and the programming errors may not be corrected by utilizing steps 534 through 548 in the flow chart 530, the redundant memory elements in step 550 may be replaced or substituted with additional redundant memory elements that may be available. After step 550, the process may proceed to end step 554. Regarding the process described in FIG. 5B, bit errors that may occur in the FEC and/or CRC data may also be considered when performing FEC and/or CRC operations.

Figure 6:
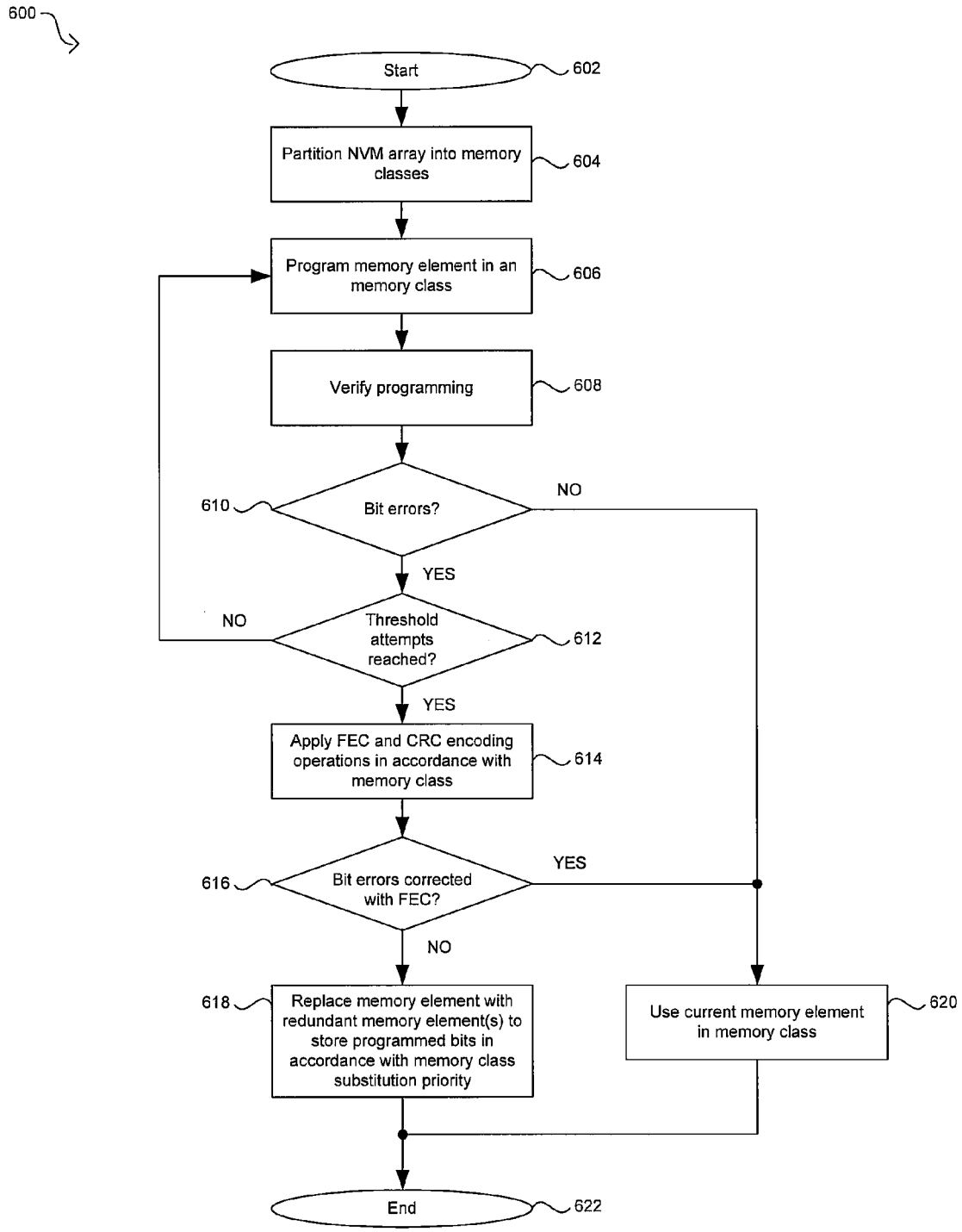
FIG. 6 is a flow diagram that illustrates exemplary steps for memory programming with correction and detection encoding operations with NVM array classes, in accordance with an embodiment of the invention.

FIG. 6 is a flow diagram that illustrates exemplary steps for memory programming with correction and detection encoding operations with NVM array classes, in accordance with an embodiment of the invention. Referring to FIG. 6, there is shown a flow diagram 600. After start step 602, in step 604, an NVM array may be partitioned into a plurality of memory classes or regions. In this regard, the NVM array may correspond to the NVM array described in FIGS. 1-4B, for example. Each of the memory classes may have an associated FEC operation, CRC operation, and/or substitution priority, for example. In step 606, data may be programmed into a memory element in one of the memory classes in the NVM array. In step 608, the data stored in the memory element may be read out of the memory element and may be compared to the original data to verify that the programming process has been successful. In step 610, when the verification in step 608 indicates that no programming errors occurred, the process in flow diagram 600 may proceed to step 620. In step 620, the original data or information bits may be stored without programming errors in the current memory element in the memory class. After step 620, the process may proceed to end step 622.

Returning to step 610, when the verification in step 608 indicates that programming errors have occurred, the process in flow diagram 600 may proceed to step 612. In step 612, when the number of programming attempts of the original data into the memory element has not reached a threshold value, the process may proceed to step 606 where an additional programming of the original data into the memory element may be attempted. Returning to step 612, when the number of programming attempts of the original data into the memory element has reached the threshold value, the process may proceed to step 614. In some instances, each memory class may have an associated programming threshold value.

In step 614, the original data or information bits may be FEC encoded and CRC encoded in accordance with the FEC and CRC operations supported by the memory class corresponding to the memory element under consideration. In this regard, the FEC encoding process may be based on a predetermined number of correctable bits. The coded bits may be stored in the memory element in order to verify whether the utilization of redundancy introduced by the FEC encoding process may correct the programming errors in the memory element. In step 616, the coded bits may be FEC decoded and CRC decoded. The CRC decoding process verifies whether the FEC encoding process resulted in the correction of all the programming errors in the memory element. When the FEC operations result in the correction of the programming errors in the memory element, the process may proceed to step 620. In steps 620, the coded bits may be stored in the current memory element. After step 620, the process may proceed to end step 622.

Returning to step 616, when the FEC operations do not correct all of the programming errors in the memory element, the process may proceed to step 618. In step 618, the memory element may be replaced or substituted with at least one redundant memory element in the NVM array in accordance with the substitution priority corresponding to the memory class. The original data or information bits may then be stored in one or more of the redundant memory elements. In this regard, verification that programming errors do not occur after programming the redundant memory elements may be necessary. When programming errors occur in the redundant memory elements and the programming errors may not be corrected by utilizing steps 606 through 616 in the flow chart 600, the redundant memory elements in step 616 may be replaced or substituted by additional redundant memory elements that may be available and in accordance with the substitution priority for the memory class. After step 616, the process may proceed to end step 622.

Figure 7:
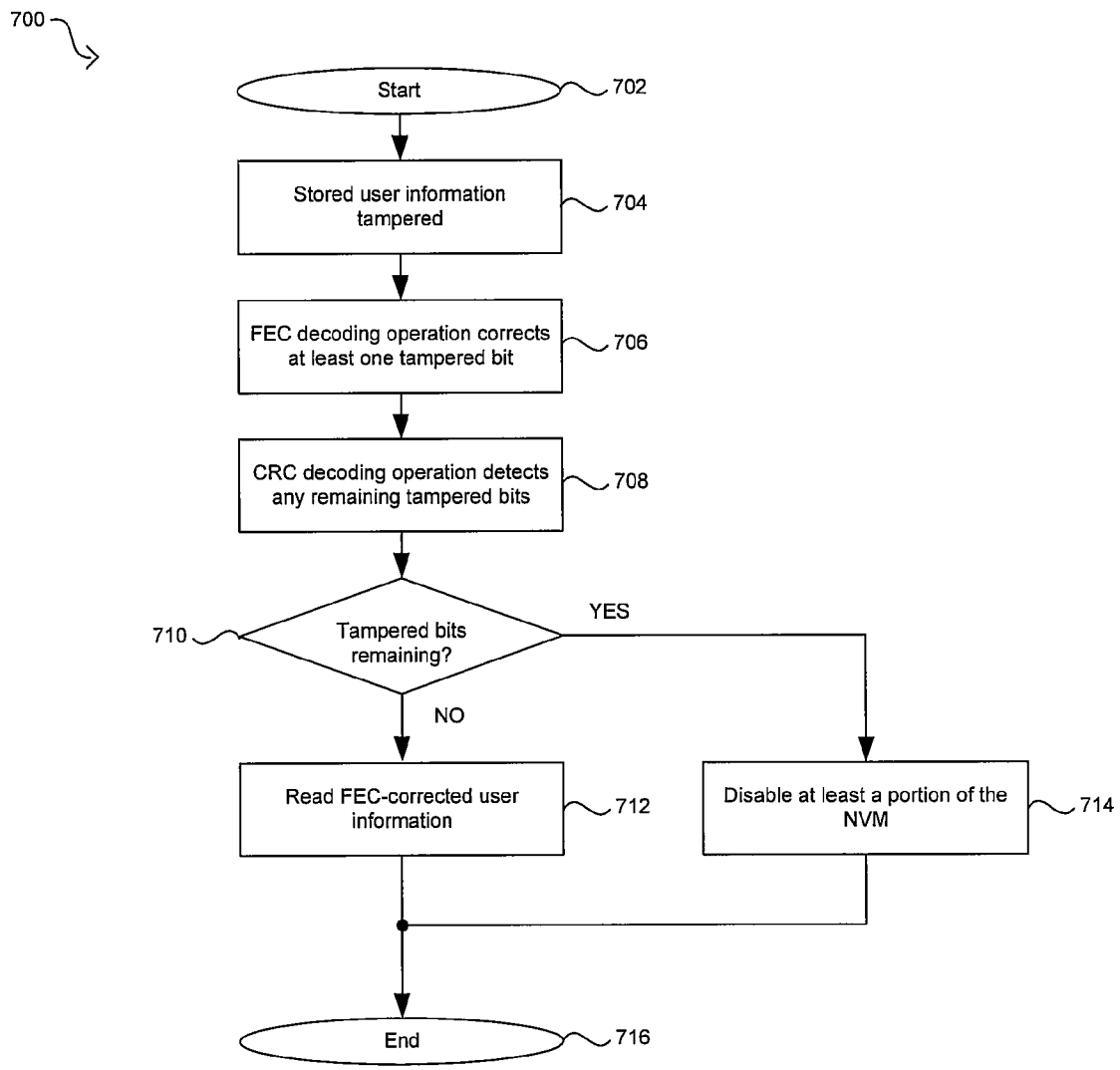
FIG. 7 is a flow diagram that illustrates exemplary steps for error correction and detection operations for secure user information, in accordance with an embodiment of the invention.

FIG. 7 is a flow diagram that illustrates exemplary steps for error correction and detection operations for secure user information, in accordance with an embodiment of the invention. Referring to FIG. 7, there is shown a flow diagram 700. In step 704, after start step 702, secure information stored in an NVM device may have been modified or tampered by an authorized user, for example. In this regard, the NVM device may correspond to the NVM device described in FIGS. 1-4B, for example. In step 706, the secured user information stored in the NVM device may have been FEC encoded and CRC encoded. An FEC decoding process may be performed on the coded bits to determine whether bit errors have occurred as a result of the tampering and to correct a predetermined number of bit errors. In step 706, the CRC decoding process may be utilized to detect any remaining bit errors not corrected by the FEC decoding in step 706. In step 710, when the CRC decoding process detects any remaining modified or tampered bits, the process in flow diagram 700 may proceed to step 714. In step 714, at least a portion of the NVM device may be disabled since the modification or tampering of secure information may not be fully corrected by FEC operations. Returning to step 710, when the CRC decoding process determines that the FEC operations corrected all modified or tampered bits, the process in flow diagram 700 may proceed to step 712. In step 712, the FEC-corrected data may be read out of the NVM device.

Accordingly, the present invention may be realized in hardware, software, or a combination thereof. The present invention may be realized in a centralized fashion in at least one computer system, or in a distributed fashion where different elements may be spread across several interconnected computer systems. Any kind of computer system or other apparatus adapted for carrying out the methods described herein may be suited. A typical combination of hardware and software may be a general-purpose computer system with a computer program that, when being loaded and executed, may control the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing data, the method comprising:
detecting one or more bit errors in a memory element, of a non-volatile memory array integrated within a chip, which remain uncorrected after forward error correction; and
utilizing a redundant memory element in place of said memory element when said uncorrected one or more bit errors is detected.

2. The method according to claim 1, comprising detecting said uncorrected one or more bit errors utilizing a cyclic redundancy check.

3. The method according to claim 1, wherein said redundant memory element is within said non-volatile memory array integrated within said chip.

4. The method according to claim 1, comprising correcting said one or more bit errors in said memory element using said forward error correction operation.

5. The method according to claim 1, wherein said forward error correction operation comprises one or both of a bit error location operation and a bit error correction operation.

6. The method according to claim 5, comprising correcting said one or more bit errors in said memory element utilizing said bit error correction operation when a location in said memory element is known to comprise said uncorrected one or more bit errors.

7. The method according to claim 1, wherein said memory element comprises secure information.

8. The method according to claim 7, comprising disabling access to said secure information when said uncorrected one or more bit errors is detected.

9. The method according to claim 7, comprising disabling access to said chip when said uncorrected one or more bit errors is detected.

10. The method according to claim 1, comprising partitioning at least a portion of said non-volatile memory array into a plurality of regions.

11. The method according to claim 10, comprising correcting via said forward error correction, a specified number of said uncorrected one or more bit errors for each of said plurality of partitioned regions.

12. The method according to claim 10, comprising substituting based on a substitution priority assigned to each of said plurality of partitioned regions, at least one of a plurality of redundant memory elements in place of said memory element when said one or more bit errors remains uncorrected in said memory element.

13. A system for processing signals, the system comprising:
one or more circuits comprising a non-volatile memory array, said non-volatile memory array integrated within a chip;
said one or more circuits are operable to detect one or more bit errors in a memory element of said non-volatile memory array, which remain uncorrected after forward error correction; and
said one or more circuits are operable to utilize a redundant memory element in place of said memory element when said uncorrected one or more bit errors is detected.

14. The system according to claim 13, wherein said one or more circuits is operable to detect said uncorrected one or more bit errors utilizing a cyclic redundancy check.

15. The system according to claim 13, wherein said redundant memory element is within said non-volatile memory array integrated within said chip.

16. The system according to claim 13, wherein said one or more circuits is operable to correct said uncorrected one or more bit errors in said memory element using said forward error correction operation.

17. The system according to claim 13, wherein said one or more circuits comprise a processor.

18. The system according to claim 13, wherein said forward error correction operation comprises one or both of a bit error location operation and a bit error correction operation.

19. The system according to claim 18, wherein said one or more circuits is operable to correct said one or more bit errors in said memory element utilizing said bit error correction operation when a location in said memory element is known to comprise said uncorrected one or more bit errors.

20. The system according to claim 13, wherein said memory element comprises secure information.

21. The system according to claim 20, wherein said one or more circuits is operable to disable access to said secure information when said uncorrected one or more bit errors is detected.

22. The system according to claim 20, wherein said one or more circuits is operable to disable access to said chip when said uncorrected one or more bit errors is detected.

23. The system according to claim 13, wherein said one or more circuits is operable to partition at least a portion of said non-volatile memory array into a plurality of regions.

24. The system according to claim 23, wherein said one or more circuits is operable to correct via said forward error correction, a specified number of said uncorrected one or more bit errors for each of said plurality of partitioned regions.

25. The system according to claim 23, wherein said one or more circuits is operable to substitute based on a substitution priority assigned to each of said plurality of partitioned regions, at least one of a plurality of redundant memory elements in place of said memory element when said one or more bit errors remains uncorrected in said memory element.

26. A machine-readable storage having stored thereon, a computer program having at least one code section for data communication, the at least one code section being executable by a machine for causing the machine to perform steps comprising:
detecting one or more bit errors in a memory element, of a non-volatile memory array integrated within a chip, which remain uncorrected after forward error correction; and
utilizing a redundant memory element in place of said memory element when said uncorrected one or more bit errors is detected.

27. The machine readable storage according to claim 26, wherein said at least one code section comprises code for detecting said uncorrected one or more bit errors utilizing a cyclic redundancy check.

28. The machine readable storage according to claim 26, wherein said redundant memory element is within said non-volatile memory array integrated within said chip.

29. The machine readable storage according to claim 26, wherein said at least one code section comprises code for correcting said one or more bit errors in said memory element using said forward error correction operation.

30. The machine readable storage according to claim 26, wherein said forward error correction operation comprises one or both of a bit error location operation and a bit error correction operation.

31. The machine readable storage according to claim 30, wherein said at least one code section comprises code for correcting said one or more bit errors in said memory element utilizing said bit error correction operation when a location in said memory element is known to comprise said uncorrected one or more bit errors.

32. The machine readable storage according to claim 26, wherein said memory element comprises secure information.

33. The machine readable storage according to claim 32, wherein said at least one code section comprises code for disabling access to said secure information when said uncorrected one or more bit errors is detected.

34. The machine readable storage according to claim 32, wherein said at least one code section comprises code for disabling access to said chip when said uncorrected one or more bit errors is detected.

35. The machine readable storage according to claim 26, wherein said at least one code section comprises code for partitioning at least a portion of said non-volatile memory array into a plurality of regions.

36. The machine readable storage according to claim 35, wherein said at least one code section comprises code for correcting via said forward error correction, a specified number of said uncorrected one or more bit errors for each of said plurality of partitioned regions.

37. The machine readable storage according to claim 35, wherein said at least one code section comprises code for substituting based on a substitution priority assigned to each of said plurality of partitioned regions, at least one of a plurality of redundant memory elements in place of said memory element when said one or more bit errors remains uncorrected in said memory element.

\* \* \* \* \*